US009354275B2

(12) United States Patent  
Akdemir et al.

(10) Patent No.: US 9,354,275 B2  
(45) Date of Patent: May 31, 2016

(54) TESTING AN INTEGRATED CIRCUIT

(71) Applicant: GLOBALFOUNDRIES Inc., Grand Cayman (KY)

(72) Inventors: Birol Akdemir, Seelze (DE); Thomas Gentner, Boeblingen (DE); Oliver Marquardt, Boeblingen (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 81 days.

(21) Appl. No.: 14/282,143

(22) Filed: May 20, 2014

(65) Prior Publication Data  
US 2014/0351664 A1 Nov. 27, 2014

(30) Foreign Application Priority Data  
May 23, 2013 (GB) .................................. 1309302.6

(51) Int. Cl.  
G06F 11/00 (2006.01)  
G01R 31/28 (2006.01)  
G01R 31/319 (2006.01)  
G01R 31/317 (2006.01)

(52) U.S. Cl.  
CPC .... G01R 31/31908 (2013.01); G01R 31/31701 (2013.01); G01R 31/31917 (2013.01)

(58) Field of Classification Search  
CPC ..... H03M 13/05; H04L 1/0041; H04L 1/242; H04L 1/203; H04L 1/08  
See application file for complete search history.

(56) References Cited

U.S. PATENT DOCUMENTS

| 4,070,657 | A | 1/1978 | Fett |
| 7,139,955 | B2 | 11/2006 | Rohrbaugh et al. |
| 7,906,982 | B1 | 3/2011 | Meade et al. |
| 2003/0126534 | A1 | 7/2003 | Roy et al. |
| 2004/0002832 | A1 | 1/2004 | Chan |
| 2004/0066207 | A1 | 4/2004 | Bottoms et al. |
| 2006/0048026 | A1 | 3/2006 | Fine et al. |
| 2007/0245199 | A1 | 10/2007 | Pochowski |
| 2008/0262778 | A1* | 10/2008 | Katagiri ................ G06F 11/263 702/119 |
| 2012/0191402 | A1 | 7/2012 | Filler et al. |

FOREIGN PATENT DOCUMENTS

WO    WO2011150409 A2    1/2011

OTHER PUBLICATIONS

Search Report under Section 17(5) for Application No. GB1309302.6 dated Nov. 15, 2013, pp. 1-3.

* cited by examiner

Primary Examiner — Guy Lamarre  
(74) Attorney, Agent, or Firm — Heslin Rothenberg Farley & Mesiti P.C.

(57) ABSTRACT

Testing an integrated circuit in a test environment that includes a virtual test engine and a test system with an integrated circuit tester. The integrated circuit is connected to the virtual test engine via the integrated circuit tester, and the integrated circuit tester is connected to the integrated circuit via an interface. The virtual test engine communicates with the integrated circuit tester via a command interface to perform functional test during functional test mode and to perform non-functional test during non-functional test mode.

20 Claims, 7 Drawing Sheets

Test Command

TESTING AN INTEGRATED CIRCUIT

PRIOR FOREIGN APPLICATION

This application claims priority from United Kingdom patent application number 1309302.6, filed May 23, 2013, which is hereby incorporated herein by reference in its entirety.

BACKGROUND

One or more aspects relate in general to the field of functional testing of hardware components, and in particular to a method and a test environment for testing an integrated circuit. Still more particularly, one or more aspects relate to a data processing program and a computer program product for testing an integrated circuit.

Currently, standard automatic test pattern generation (ATPG) is used to statically test hardware components like integrated circuits as device under test (DUT). The automatic test pattern generation (ATPG) is performed by an integrated circuit tester connected to the device under test via a first interface and allows full and fast control of the test patterns and utilizes tester capabilities like parameter variations, Shmoo plots, etc. The automatic test pattern generation (ATPG) is a well-established process (DFT) using state-based standard format and/or add-speed-BIST (Build in Selftest).

Current functional testing via a second control interface of the integrated circuit requires additional hardware for providing the applicable service protocol. This includes a specially prepared device under test load board, an additional workstation, wiring, and a protocol-capable front end device.

So the functional test needs external hardware attached to the device under test via the second interface and depends on external data describing chip specifications and/or chip access methods. The device under test (DUT) is set up to a functional stability state by the integrated circuit tester via the first interface, wherein the device under test (DUT) is stimulated by an external field service processor via the second interface. The response of the device under test (DUT) is captured by the field service processor and transmitted to a companion box comprising a workstation with engineering data of the device under test, test procedures and/or scripts and an input/output terminal, for example.

With such an approach a scheduler of the used test-system, comprising the integrated circuit tester, is not in charge of providing the test pattern to the device under test. Thus the tester software and/or pattern generator no longer tracks the inner state of the device under test. Higher-level functionality of the test system like shmoo plots and parameter variations cannot be utilized. Software effort for the additional second control interface would be required to control both the front end and the device under test. The granularity of the test result is limited by the pattern quality of the external workstation, wherein the test procedures are not identical to system drivers of the integrated circuit tester. Stopping at a specific event like a failure and/or hit condition is not possible, and there is no interference with the tester scheduler. It is difficult to identify both that there is an error and the location of the error.

BRIEF SUMMARY

In an embodiment, a method of testing an integrated circuit in a test environment is provided. The method includes, for instance, enabling a functional test mode of an integrated circuit wherein the integrated circuit is connected to a virtual test engine of the test environment via an integrated circuit tester of the test environment, the virtual test engine to communicate with the integrated circuit tester via a command interface to perform functional test during functional test mode and to perform non-functional test during non-functional test mode, and the integrated circuit tester is connected to the integrated circuit via an interface; creating and transmitting at least one of functional or non-functional test commands to said integrated circuit tester, wherein the integrated circuit tester creates and applies test patterns as stimulus data to the integrated circuit based on said functional test commands, receives and analyzes response data from the integrated circuit, and transmits test results including said response data to said virtual test engine for further analyzing; enabling the non-functional test mode of the integrated circuit in case a failure is detected during the functional test; shifting a serial bit stream out of the integrated circuit in the non-functional test mode, wherein the integrated circuit tester transmits the serial bit stream as an error bit stream to the virtual test engine for further analyzing; and wherein the virtual test engine creates and transmits at least one of further functional or non-functional test commands to the integrated circuit tester based on at least one of the test results or the error bit stream.

In another embodiment, a test environment for testing an integrated circuit is provided. The test environment includes, for instance, a virtual test engine and a test system with an integrated circuit tester, wherein the integrated circuit is connected to the virtual test engine via the integrated circuit tester, and the integrated circuit tester is connected to the integrated circuit via an interface; the virtual test engine to communicate with the integrated circuit tester via a command interface to perform a functional test during a functional test mode and to perform a non-functional test during a non-functional test mode of the integrated circuit, wherein the integrated circuit tester includes a test vector memory to generate at least one test pattern; the virtual test engine to create and transmit at least one of functional or non-functional test commands to the integrated circuit tester; the integrated circuit tester to create and apply test patterns as stimulus data to the integrated circuit based on said functional test commands, to receive and analyze response data from the integrated circuit, and to transmit test results including the response data to the virtual test engine for further analyzing; the virtual test engine to enable the non-functional test mode of the integrated circuit in case a failure is detected during the functional test, and the integrated circuit tester to shift a serial bit stream out of the integrated circuit in the non-functional test mode, and to transmit the serial bit stream as an error bit stream to the virtual test engine for further analyzing; and the virtual test engine to create and transmit at least one of further functional or non-functional test commands to the integrated circuit tester based on at least one of the test results or the error bit stream.

In a further embodiment, a computer program product for testing an integrated circuit in a test environment is provided. The computer program product includes, for instance, a computer readable storage medium readable by a processing circuit and storing instructions for execution by the processing circuit for performing a method. The method includes, for instance, enabling a functional test mode of an integrated circuit, wherein the integrated circuit is connected to a virtual test engine of the test environment via an integrated circuit tester of the test environment, the virtual test engine to communicate with the integrated circuit tester via a command interface to perform functional test during functional test mode and to perform non-functional test during non-functional test mode, and the integrated circuit tester is connected to said integrated circuit via an interface; creating and transmitting at least one of functional or non-functional test commands to the integrated circuit tester, wherein the integrated circuit tester creates and applies test patterns as stimulus data to the integrated circuit based on said functional test commands, receives and analyzes response data from the integrated circuit, and transmits test results including the response data to the virtual test engine for further analyzing; enabling the non-functional test mode of the integrated circuit in case a failure is detected during the functional test; shifting a serial bit stream out of the integrated circuit in the non-functional test mode, wherein the integrated circuit tester transmits the serial bit stream as an error bit stream to the virtual test engine for further analyzing; and wherein the virtual test engine creates and transmits at least one of further functional or non-functional test commands to the integrated circuit tester based on at least one of the test results or the error bit stream.

BRIEF DESCRIPTION OF THE SEVERAL VIEWS OF THE DRAWINGS

One embodiment, as described in detail below, is shown in the drawings, in which.

DETAILED DESCRIPTION

Figure 1:
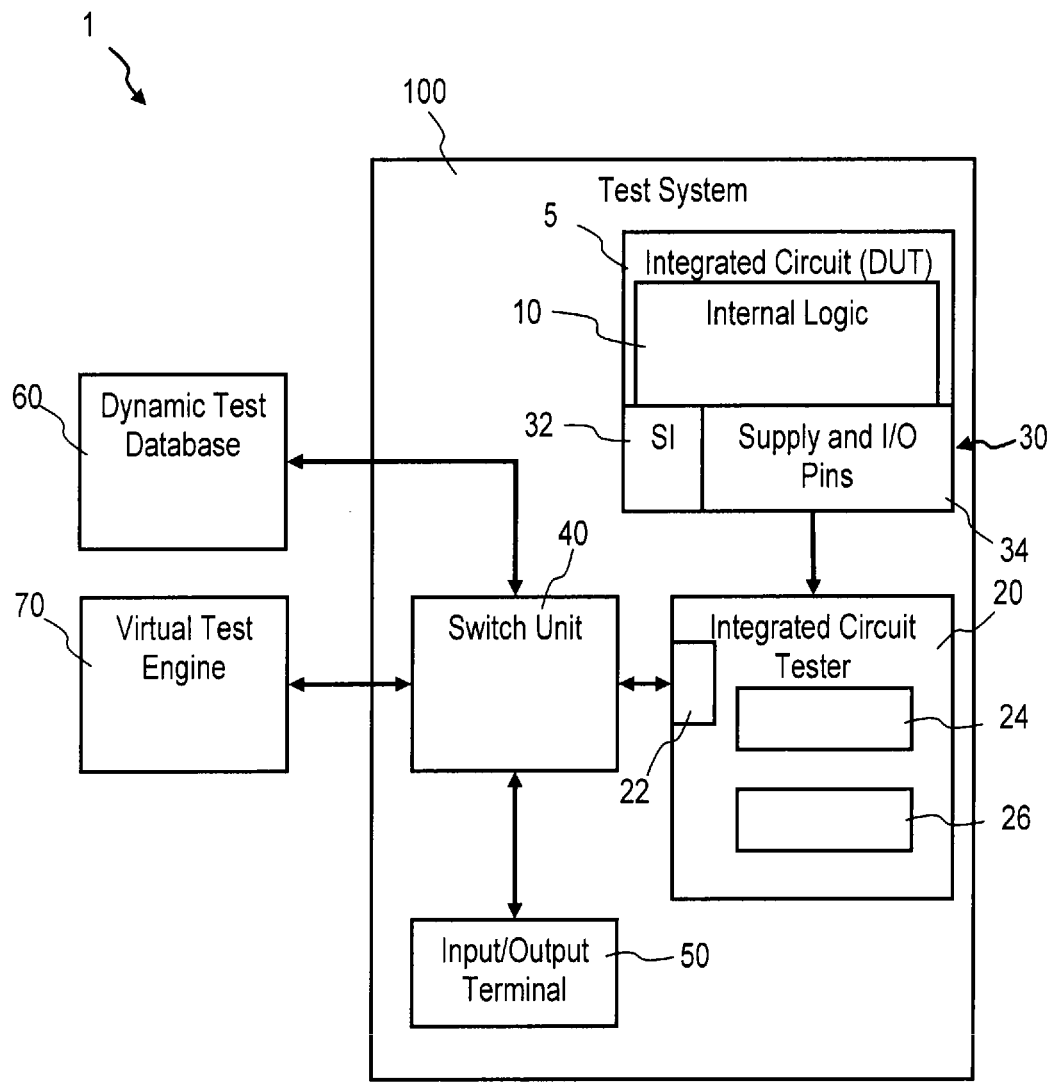
FIG. 1 is a schematic block diagram of a test environment for testing an integrated circuit, in accordance with an embodiment.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2:
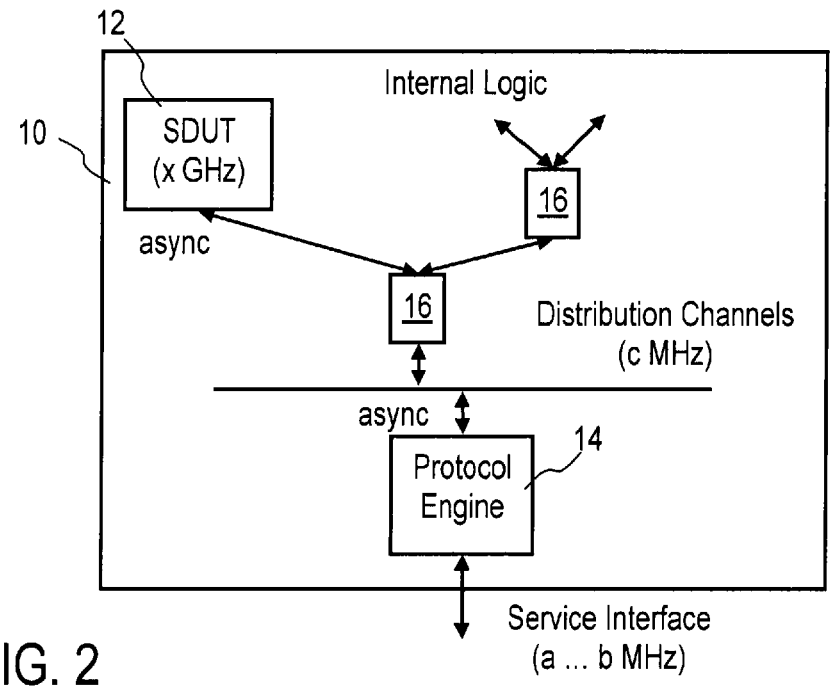
FIG. 2 is a schematic block diagram of an internal logic of an integrated circuit as device under test.
Figure 3:
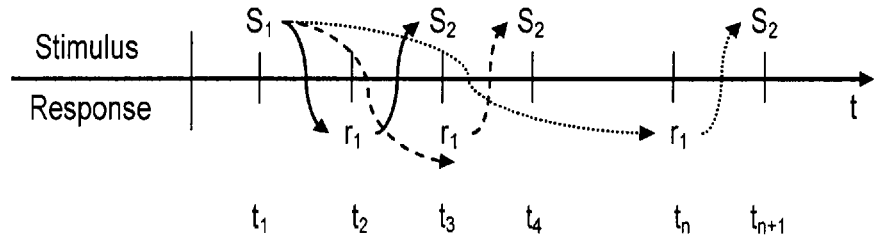
FIG. 3 is a schematic diagram of direct response actions as part of a test protocol between the integrated circuit tester and the device under test, in accordance with an embodiment.
Figure 4:
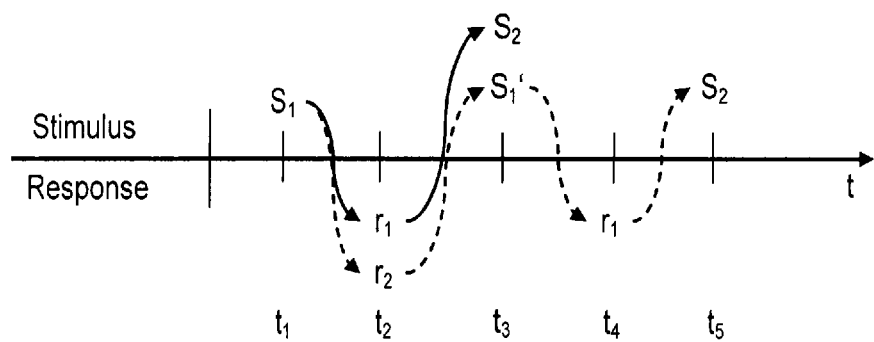
FIG. 4 is a schematic diagram of a direct response action and an indirect response action as part of a test protocol between the integrated circuit tester and the device under test, in accordance with an embodiment.
Figure 5:
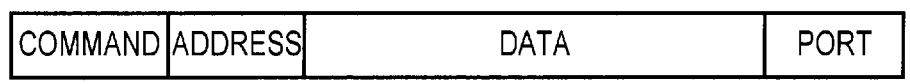
FIG. 5 is a schematic diagram of a test command, in accordance with an embodiment.
Figure 6:
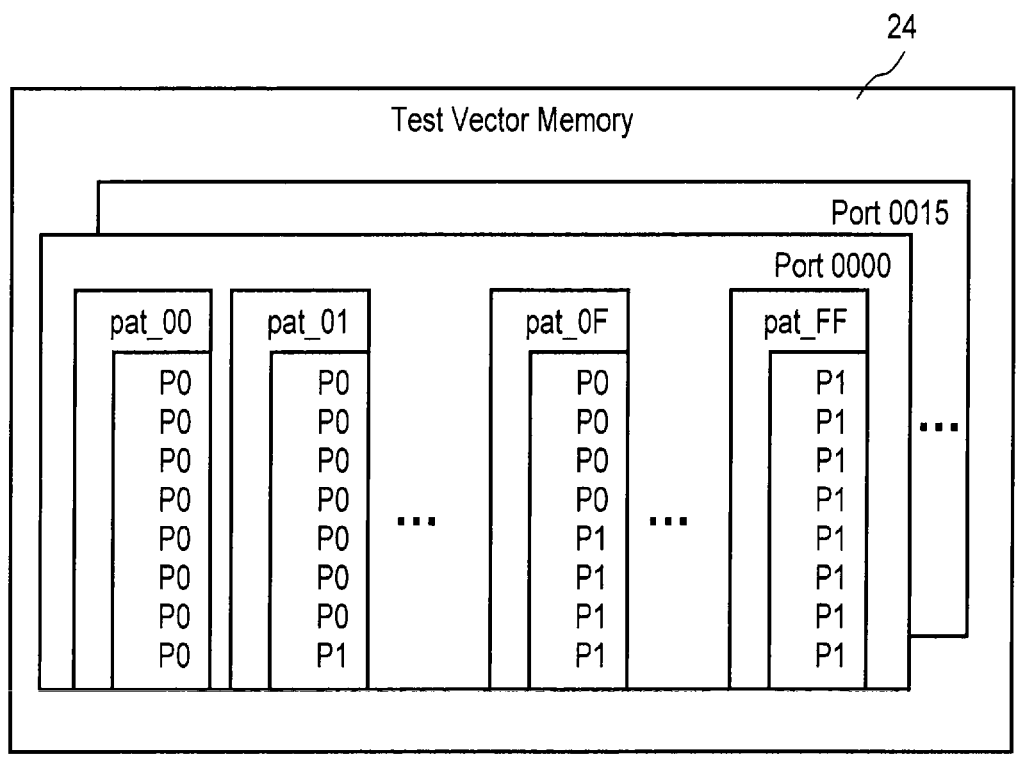
FIG. 6 is a schematic block diagram of a test vector memory, in accordance with an embodiment.

FIG. 1 shows a test environment 1 for testing an integrated circuit 5, in accordance with an embodiment of the present invention; FIG. 2 shows an internal logic of an integrated circuit 5 as device under test; FIG. 3 shows direct response actions as part of a test protocol between an integrated circuit tester 20 and the device under test 5, in accordance with an embodiment of the present invention; FIG. 4 shows a direct driven action and an indirect response action as part of a test protocol between the integrated circuit tester 20 and the device under test 5, in accordance with an embodiment of the present invention; FIG. 5 shows a test command, in accordance with an embodiment of the present invention; and FIG. 6 shows a test vector memory 24, in accordance with an embodiment of the present invention.

Referring to FIGS. 1 to 6, the shown embodiment of the present invention employs a test environment 1 to test an integrated circuit 5. The test environment 1 comprises a virtual test engine 70 and a test system 100 with an integrated circuit tester 20, a switch unit 40 and an input/output terminal 50. The virtual test engine 70 could be any server system or computer system or network suitable to run a corresponding test protocol or test program. The integrated circuit 5 is connected to the virtual test engine 70 via the integrated circuit tester 20. The integrated circuit tester 20 is connected to the integrated circuit 5 via an interface 30. The interface 30 comprises a service interface 32 and supply and input/output pins 34. The virtual test engine 70 communicates with the integrated circuit tester 20 via a command interface 22 to perform a functional test during a functional test mode and to perform a non-functional test during a non-functional test mode of the integrated circuit 5. In the shown embodiment the test system 100 is also connected to a dynamic test data base 60 holding firmware and specification of the integrated circuit 5, i.e. the device under test.

The virtual test engine 70 runs a functional test protocol or test program and creates and transmits corresponding functional and/or non-functional test commands, exemplary shown in FIG. 5, to the integrated circuit tester 20. Such functional and/or non-functional test commands each comprise a command identification block COMMAND; an address block ADDRESS; a data block DATA; and a port block PORT. The functional test commands comprise stimulus data and expected response data from the device under test 5 as function of the stimulus data. Further the virtual test engine could transmit windows or ranges for values of the expected response data and corresponding response time windows or ranges within which the device under test 5 has to transmit the response data.

The integrated circuit tester 20 comprises a test vector memory 24 to generate at least one test pattern and a scheduler 26 to execute the functional and/or non-functional test commands of virtual test engine 70. The integrated circuit tester 20 creates and applies test patterns as stimulus data to the integrated circuit 5 based on the functional test commands, receives and analyzes response data from the integrated circuit 5; and transmits test results including the response data to the virtual test engine 70 for further analyzing. During the analyzing process the integrated circuit tester 20 compares the test results with the expected response data of the functional test commands. Referring to FIGS. 3 and 4, the functional test protocol allows a direct response r1 action to a corresponding stimulus action S1 or an indirect response r1 action via an intermediate response r2 action and an intermediate stimulus action S1' based on a certain stimulus S1. Further, the response action r1 could cause or create new stimulus data S2. Still referring to FIGS. 3 and 4, the integrated circuit 5, i.e. the device under test, can create the response action r1 to different points of time t2, t3, t4, to based on the stimulus data S1. The time range within which the integrated circuit 5, i.e. the device under test, has to deliver the corresponding response action r1 is defined by the virtual test engine 70 or the test protocol or test program.

The virtual test engine 70 enables the non-functional test mode of the integrated circuit 5 in case a failure is detected during the functional test, and the integrated circuit tester 20 shifts a serial bit stream out of the integrated circuit 5 in the non-functional test mode, and transmits the serial bit stream as error bit stream to the virtual test engine 70 for further analyzing. The virtual test engine 70 creates and transmits further functional and/or non-functional test commands to the integrated circuit tester 20 based on the test results and/or the error bit stream.

The integrated circuit 5 comprises an internal logic 10. Referring to FIG. 2, the internal logic 10 comprises a sub-device under test 12, for example a functional entity with a certain first bandwidth, distribution nodes 16 and distribution channels with a certain second bandwidth and a protocol engine 14 connected to the service interface 32 and controlling the distribution channels and distribution nodes 16 based on stimulus data received from the integrated circuit tester 20 and response data created by the internal logic 10.

Further the integrated circuit tester 20 is configured to shift a serial bit stream in the integrated circuit 5 during the non-functional test mode such that state-holding latches of the internal logic 10 are initialized to pre-defined values when the integrated circuit 5 is operated in the functional test mode afterwards. The integrated circuit tester 20 is further configured to read these latches by shifting a serial bit stream out of the integrated circuit 5 in the non-functional test mode. The integrated circuit tester 20 supplies the pre-defined serial bit stream via the service interface 32 being part of the interface 30 to the integrated circuit 5 to test. The integrated circuit 5 to test outputs the resulting serial bit stream via the service interface 32 to the integrated circuit tester 20.

To perform at least one static test during the non-functional test the integrated circuit tester 20 supplies a corresponding static test bit pattern to the pins of the interface 30. The test environment 1 is able to perform a contact test, a power test, or automatic test pattern generation test with the integrated circuit 5, i.e. the device under test.

To perform the functional test the integrated circuit tester 20 prepares the test vector memory 24 by setting signal level, signal timing and pattern templates, wherein the integrated circuit tester 20 stores at least two pre-defined test patterns in the test vector memory 24 and selects one of the pre-defined bit patterns or any combination of composite bit pattern subsets in the test vector memory 24 in dependence of a subset of the bits in the received bit stream of the response data.

During the function test the integrated circuit tester 20 is able to create a shmoo plot by monitoring at least two parameters while varying at least one of the parameters over a specified range, based on a functional test command sequence. For example, the integrated circuit tester 20 is configured to perform a chip pad receiver test with the device under test 5 by variation of supply voltage versus process speed of the device under test 5, and/or to perform a chip pad driver test with the device under test 5 and to scope an image of the chip response.

FIGS. 7 to 10 show an exemplary implemented embodiment of a method for testing an integrated circuit 5, in accordance with an embodiment of the present invention.

Figure 7:
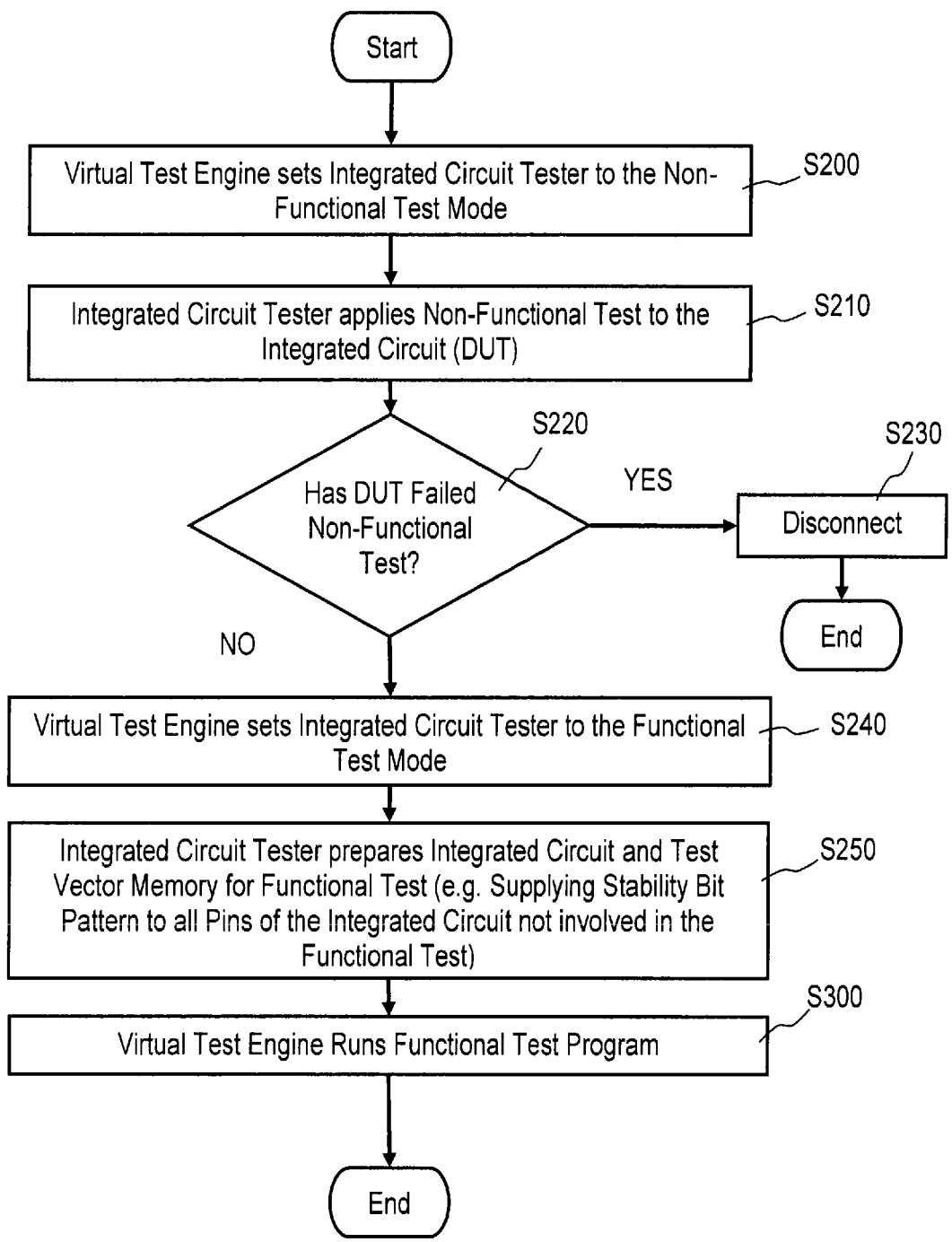
FIGS. 7 to 10 show a schematic flow diagram of a method for testing an integrated circuit, in accordance with an embodiment.

Referring to FIG. 7, after starting the method for testing an integrated circuit 5 in a test environment 1 the virtual test engine 70 enables the functional test mode of the integrated circuit 5, i.e. the device under test, and sets the integrated circuit tester 20 to the non-functional test mode in step S200. Therefore the virtual test engine 70 creates and transmits a non-functional test command to the integrated circuit tester 20. In step S210 the integrated circuit tester 20 applies the non-functional test to the integrated circuit 5, i.e. the device under test. In step S220 the integrated circuit tester 20 proofs if the device under test 5 has failed the non-functional test. In case the device under test 5 has failed, the device under test 5 is disconnected in step S240 and the testing of the device under test 5 is finished. In case the device under test 5 has passed the non-functional test, the virtual test engine 70 sets the integrated circuit tester 20 to the functional test mode in step S240. In step S250 the integrated circuit tester 20 prepares the integrated circuit 5 and the test vector memory 24 for the functional test. The integrated circuit tester 20 supplies a stability bit pattern to all pins of the device under test 5 not involved in the functional test, for example. In step S300 the virtual test engine 70 runs the functional test program, comprising the steps S310 to S580.

Figure 8:
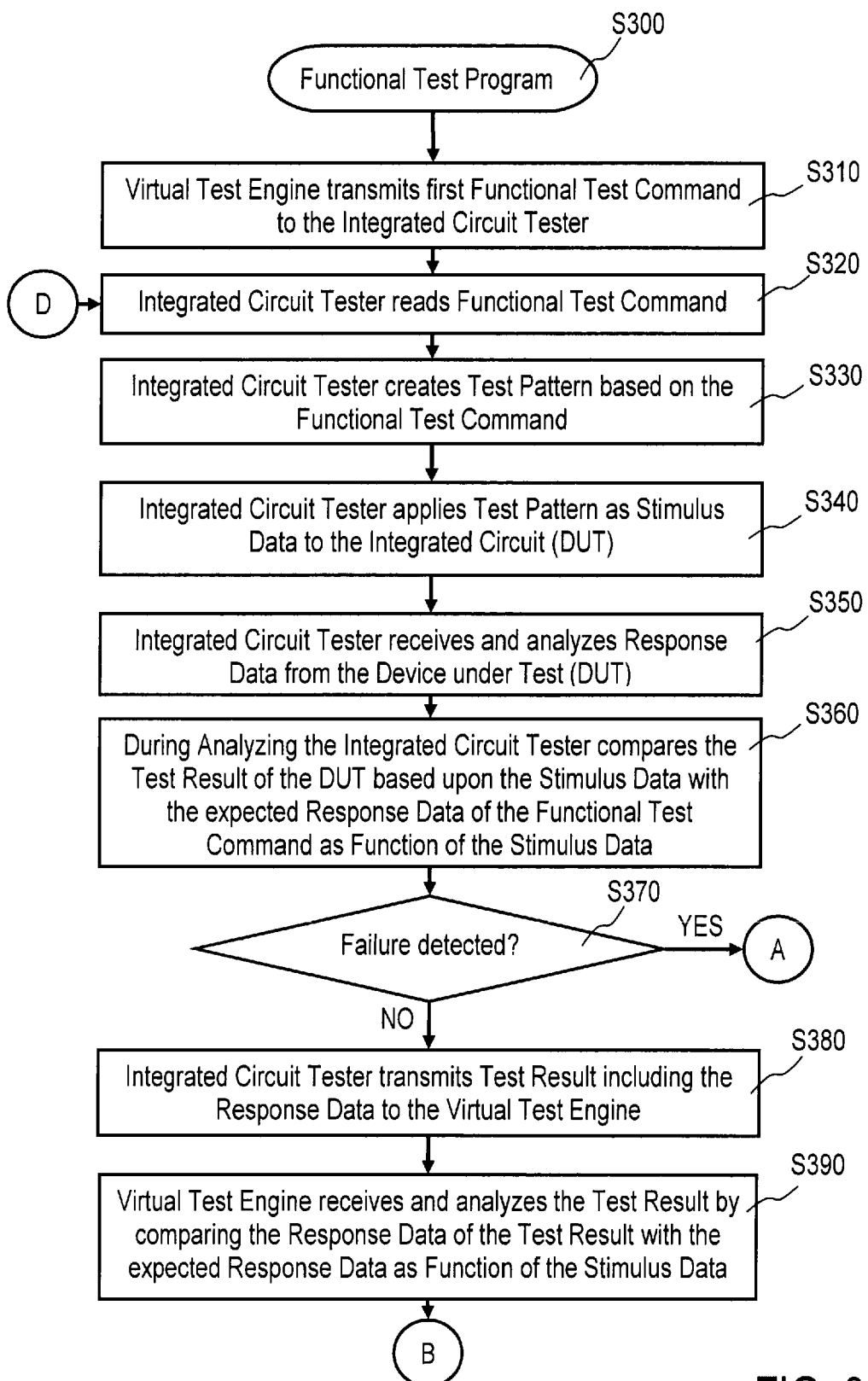
Figure 9:
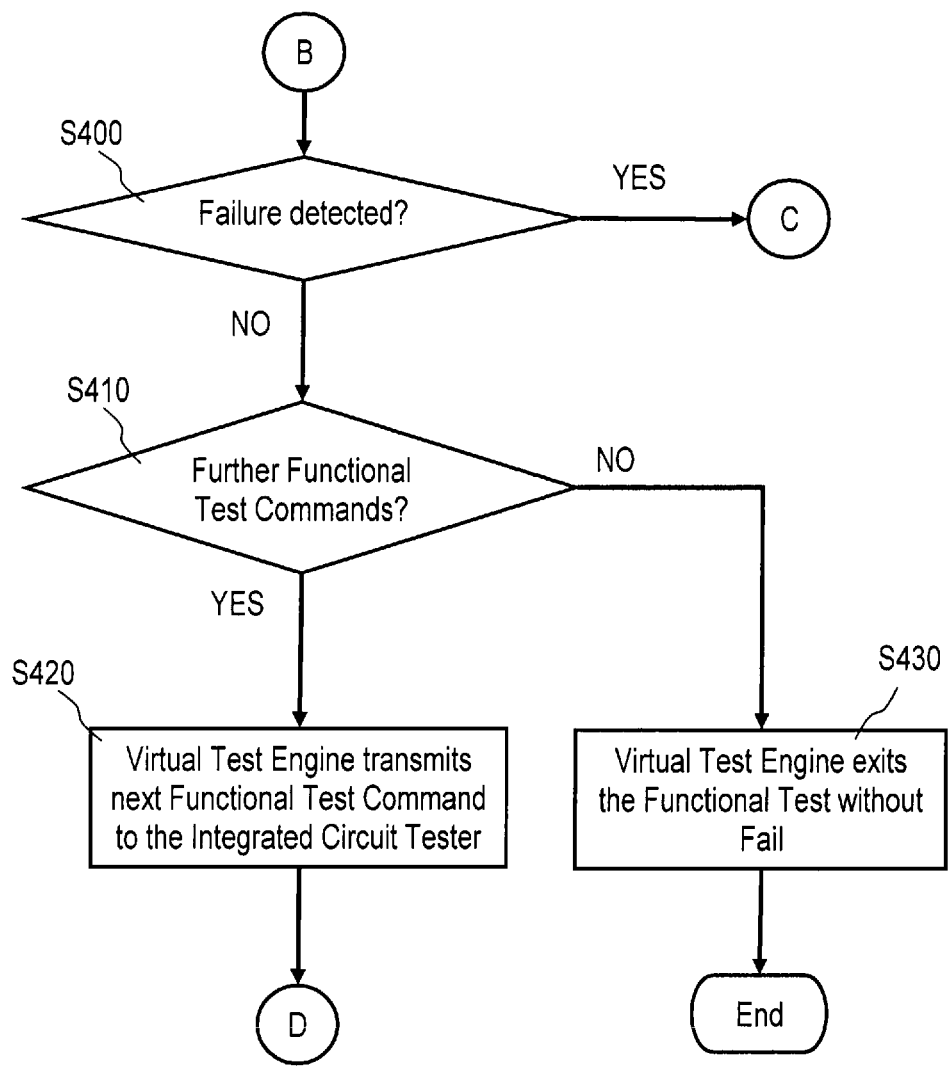
Figure 10:
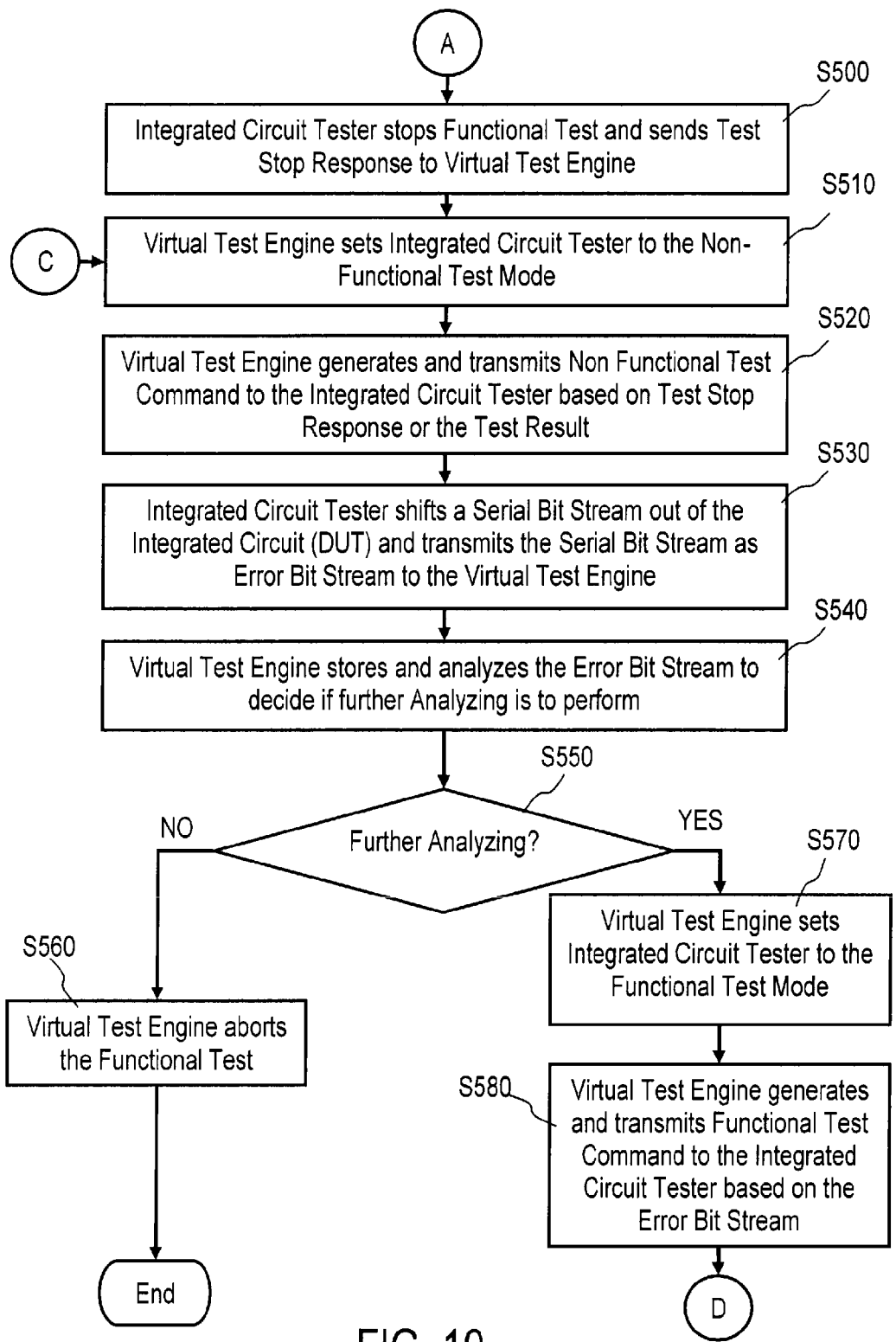

Referring to FIGS. 8 to 10, the virtual test engine 70 creates and transmits a first functional test command to the integrated circuit tester 20 in step S310. In steps S320 and S330 the integrated circuit tester 20 reads the functional test command and creates a test pattern based on the functional test command. In step S340 the integrated circuit tester 20 applies the test pattern as stimulus data to the device under test 5. In step S350 the integrated circuit tester 20 receives and analyzes response data from the device under test 5. During the analyzing process in step S360 the integrated circuit tester 20 compares the test result of the device under test 5 based upon the stimulus Data with the expected response data of the functional test command as function of the stimulus data. In step S370 the integrated circuit tester 20 branches to step S500, shown in FIG. 10, in case a failure is detected. In case no failure is detected, the integrated circuit tester 20 transmits the test result including the response data to the virtual test engine 70 in step S380. In step S390 the virtual test engine 70 receives and analyzes the test result by comparing the response data of the test result with the expected response data as function of the stimulus data. In step S400 (FIG. 9) the virtual test engine 70 branches to step S510, shown in FIG. 10, in case a failure is detected. In case no failure is detected, the virtual test engine 70 proofs in step S410 if further functional test commands are to be performed. In case no further functional test commands are to be performed, the virtual test engine 70 exits the functional test without fail in step S430 and the testing of the device under test 5 is finished. In case at least one further functional test command is to be performed, the virtual test engine 70 transmits the next functional test command to the integrated circuit tester 20 in step S420. Then the method is continued with step S320, shown in FIG. 8.

Now referring to FIG. 10, in case the integrated circuit tester 20 has detected a failure in step S370, the integrated circuit tester 20 stops the functional test and sends a test stop response to the virtual test engine 70 in step S500. In step S510 the virtual test engine 70 sets the integrated circuit tester 20 to the non-functional test mode and generates and transmits a non-functional test command in step S520 to the integrated circuit tester 20 based on the test stop response or the test result. In step S530 the integrated circuit tester 20 shifts a serial bit stream out of the integrated circuit 5 and transmits the serial bit stream as error bit stream to the virtual test engine 70 for further analyzing. The virtual test engine 70 stores and analyzes the error bit stream in step S540 to decide if a further analyzing process is to perform. In case no further analyzing process is to perform, the virtual test engine 70 aborts the functional test in step S560 and the testing of the device under test 5 is finished. In case a further analyzing process is to perform, the virtual test engine 70 sets the integrated circuit tester 20 to the functional test mode in step S570. In step S580 the virtual test engine 70 generates and transmits the next functional test command to the integrated circuit tester 20 based on the error bit stream. Then the method is continued with step S320, shown in FIG. 8.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A technical problem underlying one or more aspects of the present invention is to provide a method and a test environment for testing an integrated circuit without the need of additional hardware for providing an applicable service protocol and which are able to solve shortcomings and pain points of prior art methods and test environments for testing integrated circuits.

Accordingly, in an embodiment, a method for testing an integrated circuit in a test environment comprises the steps of enabling a functional test mode of the integrated circuit; and creating and transmitting functional and/or non-functional test commands to an integrated circuit tester. The integrated circuit tester creates and applies test patterns as stimulus data to the integrated circuit based on the functional test commands, receives and analyzes response data from the integrated circuit; and transmits test results including the response data to a virtual test engine for further analyzing. In further steps the method enables a non-functional test mode of the integrated circuit in case a failure is detected during the functional test and shifts a serial bit stream out of the integrated circuit in the non-functional test mode. The integrated circuit tester transmits the serial bit stream as error bit stream to the virtual test engine for further analyzing. The virtual test engine creates and transmits further functional and/or non-functional test commands to the integrated circuit tester based on the test results and/or the error bit stream. The test environment comprises the virtual test engine and a test system with the integrated circuit tester. The integrated circuit is connected to the virtual test engine via the integrated circuit tester, the virtual test engine communicates with the integrated circuit tester via a command interface to perform the functional test during functional test mode and to perform the non-functional test during non-functional test mode, and the integrated circuit tester is connected to the integrated circuit via an interface.

In further embodiments, at least one of the following static tests is performed during the non-functional test: Contact test, power test, or automatic test pattern generation test.

In further embodiments, the test result and/or the error bit stream are analyzed by comparing response data of the test result or the error bit stream with expected response data as function of the stimulus data.

In further embodiments, the functional test protocol allows a direct response action or an indirect response action via an intermediate response action based on a certain stimulus.

In further embodiments, the integrated circuit tester supplies a stability bit pattern to all pins of the interface of the integrated circuit not involved in the functional test.

In further embodiments, the integrated circuit tester prepares a test vector memory by setting signal level, signal timing and pattern templates to perform the functional test.

In further embodiments, the integrated circuit tester stores at least two pre-defined test patterns in the test vector memory and selects one of the pre-defined bit patterns or any combination of composite bit pattern subsets in the test vector memory in dependence of a subset of the bits in the received bit stream of the response data.

In further embodiments, the integrated circuit tester creates a shmoo plot during the function test by monitoring at least two parameters while varying at least one of the parameters over a specified range.

In another embodiment, a test environment for testing an integrated circuit comprises a virtual test engine and a test system with an integrated circuit tester. The integrated circuit is connected to the virtual test engine via the integrated circuit tester connected to the integrated circuit via an interface. The virtual test engine communicates with the integrated circuit tester via a command interface to perform a functional test during a functional test mode and to perform a non-functional test during a non-functional test mode of the integrated circuit. The integrated circuit tester comprises a test vector memory to generate at least one test pattern. The virtual test engine creates and transmits functional and/or non-functional test commands to the integrated circuit tester. The integrated circuit tester creates and applies test patterns as stimulus data to the integrated circuit based on the functional test commands, receives and analyzes response data from the integrated circuit; and transmits test results including the response data to the virtual test engine for further analyzing. The virtual test engine enables the non-functional test mode of the integrated circuit in case a failure is detected during the functional test, and the integrated circuit tester shifts a serial bit stream out of the integrated circuit in the non-functional test mode, and transmits the serial bit stream as error bit stream to the virtual test engine for further analyzing. The virtual test engine creates and transmits further functional and/or non-functional test commands to the integrated circuit tester based on the test results and/or the error bit stream.

In further embodiments, the integrated circuit tester is configured to shift a serial bit stream in the integrated circuit during the non-functional test mode such that state-holding latches are initialized to pre-defined values when the integrated circuit is operated in the functional test mode afterwards, and the integrated circuit tester is further configured to read these latches by shifting a serial bit stream out of the integrated circuit in the non-functional test mode.

In further embodiments, the integrated circuit tester supplies at least one static test bit pattern to pins of the interface to perform at least one of the following static tests during the non-functional test: Contact test, power test, or automatic test pattern generation test.

In further embodiments, the integrated circuit tester supplies the pre-defined serial bit stream via a service interface being part of the interface to the integrated circuit to test, and wherein the integrated circuit to test outputs the resulting serial bit stream via the service interface to the integrated circuit tester.

In further embodiments, the integrated circuit tester prepares the test vector memory by setting signal level, signal timing and pattern templates to perform the functional test, wherein the integrated circuit tester stores at least two pre-defined test patterns or any combination of composite bit pattern subsets in the test vector memory and selects one of the pre-defined bit patterns in the test vector memory in dependence of a subset of the bits in the received bit stream of the response data.

In another embodiment, a data processing program for execution in a data processing system comprises software code portions for performing a method for testing an integrated circuit when the program is run on the data processing system.

In yet another embodiment, a computer program product stored on a computer-usable medium, comprises computer-readable program means for causing a computer to perform a method for testing an integrated circuit when the program is run on the computer.

In one embodiment, the integrated circuit to test is connected to the virtual test engine of the test environment via the integrated circuit tester, so that the virtual test engine communicates with the integrated circuit tester to perform a functional test of the integrated circuit during a functional test mode and to perform a non-functional test of the integrated circuit during a non-functional test mode. So chip service interface functionality is integrated in the test system comprising the integrated circuit tester creating chip service interface test patterns executed by the test system sequencer. The device under test (DUT) is completely observed and controlled by the test system and no external hardware is connected to the device under test. The test system comprises a chip service interface terminal access mechanism to receive functional and non-functional commands from the virtual test engine, which could be any server system or computer system or network running a corresponding test protocol. The test system with the integrated circuit tester could comprise a network interface to external server systems like the System z of International Business Machines Corporation, Armonk, N.Y. This means, that original System z driver firmware is run at the integrated circuit tester. At the same time full test system debug functionality is available.

All in all, embodiments allow an interference of the test protocol run by the virtual test engine with a scheduler of the integrated circuit tester. The scheduler of the integrated circuit tester is still in charge of providing the test pattern to the device under test. Thus the tester software/pattern generator does track the inner state of the device under test. Higher-level functionality of the test system like shmoo plots and parameter variations can be utilized. Also stopping the test procedure at a specific event like a defined failure and/or hit condition is possible.

Further, embodiments allow identifying an error occurrence and a corresponding error location. Since the control- and/or observation flow is done by the scheduler of the test system error granularity and/or error observation possibilities are as good as those of the test system. Therefore a fast reproducibility of error scenarios is possible. In a minimal approach no additional external hardware is required.

Further embodiments offer better connecting possibilities to standard automatic test equipment software.

The above, as well as additional purposes, features, and advantages are apparent in the detailed written description.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of testing an integrated circuit in a test environment, said method comprising:

enabling, by a virtual test engine, a functional test mode of said integrated circuit in said test environment, wherein said test environment comprising the virtual test engine and an integrated circuit tester, said virtual test engine communicating with said integrated circuit tester via a command interface to perform a functional test during the functional test mode and to perform a non-functional test during a non-functional test mode, and said integrated circuit tester is connected to said integrated circuit via an interface;

creating and transmitting, by the virtual test engine, a first functional test command of at least one functional test command respectively comprising stimulus data and expected response data to said integrated circuit tester, wherein said integrated circuit tester creates and applies test patterns corresponding to the stimulus data of the first functional test command to the integrated circuit, receives and analyzes response data from said integrated circuit, and transmits test results including said response data to said virtual test engine for further analyzing, responsive to determining that the response data from the integrated circuit is similar to the expected response data in the first functional test command;

enabling said non-functional test mode of said integrated circuit, responsive to determining by the virtual test engine that the first functional test command had failed, followed by generating and transmitting, to the integrated circuit tester, a first non-functional test command of at least one non-functional test command directing the integrated circuit tester for shifting a serial bit stream out of said integrated circuit in said non-functional test mode and for transmitting said serial bit stream as an error bit stream to said virtual test engine for further analyzing; and re-enabling the functional test mode of the integrated circuit responsive to determining to test the integrated circuit for further analysis based on storing and analyzing the error bit stream by the virtual test engine, wherein said virtual test engine creates and transmits a second functional test command of the at least one functional test command to said integrated circuit tester.

2. The method according to claim 1, wherein at least one of the following static tests is performed during said non-functional test: contact test, power test, or automatic test pattern generation test.

3. The method according to claim 1, wherein the at least one of said test result or said error bit stream is analyzed by comparing response data of said test result or said error bit stream with expected response data as function of said stimulus data.

4. The method according to claim 3, wherein said functional test mode allows a direct response action or an indirect response action via an intermediate response action based on a certain stimulus.

5. The method according to claim 1, wherein said integrated circuit tester supplies a stability bit pattern to all pins of said interface of said integrated circuit not involved in said functional test.

6. The method according to claim 1, wherein said integrated circuit tester prepares a test vector memory of the integrated circuit tester by setting signal level, signal timing and pattern templates to perform said functional test.

7. The method according to claim 6, wherein said integrated circuit tester stores at least two pre-defined test patterns in said test vector memory and selects one of the pre-defined bit patterns or any combination of composite bit pattern subsets in the test vector memory in dependence of a subset of bits in the received bit stream of said response data.

8. The method according to claim 1, wherein said integrated circuit tester creates a shmoo plot during said function test by monitoring at least two parameters while varying at least one of said parameters over a specified range.

9. A test environment for testing an integrated circuit comprising:

a virtual test engine and a test system comprising the integrated circuit and an integrated circuit tester, wherein said integrated circuit is connected to said virtual test engine via said integrated circuit tester, and said integrated circuit tester is connected to said integrated circuit via an interface;

said virtual test engine to communicate with said integrated circuit tester via a command interface to perform a functional test during a functional test mode and to perform a non-functional test during a non-functional test mode of said integrated circuit, wherein said integrated circuit tester comprises a test vector memory to generate and to store at least one test pattern;

said virtual test engine to enable the functional test mode and to create and transmit a first functional test command of at least one functional test command respectively comprising stimulus data and expected response data to said integrated circuit tester;

said integrated circuit tester to create and apply test patterns corresponding to the stimulus data of the first functional test command to said integrated circuit, to receive and analyze response data from said integrated circuit, and to transmit test results including said response data to said virtual test engine for further analyzing, responsive to determining that the response data from the integrated circuit is similar to the expected response data in the first functional test command;

said virtual test engine to enable said non-functional test mode of said integrated circuit responsive to determining that the first functional test command had failed and to create and transmit a first non-functional test command of at least one non-functional test command to direct said integrated circuit tester to shift a serial bit stream out of said integrated circuit in said non-functional test mode, and to transmit said serial bit stream as an error bit stream to said virtual test engine for further analyzing; and said virtual test engine to re-enable the functional test mode of the integrated circuit responsive to determining to test the integrated circuit for further analysis based on storing and analyzing the error bit stream, and to create and transmit a second functional test command of the at least one functional test command to said integrated circuit tester.

10. The test environment according to claim 9, wherein said integrated circuit tester is configured to shift a serial bit stream in said integrated circuit during said non-functional test mode such that state-holding latches are initialized to pre-defined values when said integrated circuit is operated in said functional test mode afterwards, and said integrated circuit tester is further configured to read these latches by shifting a serial bit stream out of said integrated circuit in said non-functional test mode.

11. The test environment according to claim 9, wherein said integrated circuit tester supplies at least one static test bit pattern to pins of said interface to perform at least one of the following static tests during said non-functional test: contact test, power test, or automatic test pattern generation test.

12. The test environment according to claim 9, wherein said integrated circuit tester supplies a pre-defined serial bit stream via a service interface being part of said interface to said integrated circuit to test, and wherein said integrated circuit to test outputs said resulting serial bit stream via said service interface to said integrated circuit tester.

13. The test environment according to claim 9, wherein said integrated circuit tester prepares said test vector memory by setting signal level, signal timing and pattern templates to perform said functional test, wherein said integrated circuit tester stores at least two pre-defined test patterns in said test vector memory and selects one of the pre-defined bit patterns or any combination of composite bit pattern subsets in the test vector memory in dependence of a subset of bits in the received bit stream of said response data.

14. A computer program product for testing an integrated circuit in a test environment, said computer program product comprising:
    a computer readable storage medium readable by a processing circuit and storing instructions for execution by the processing circuit for performing a method comprising:
    enabling, by a virtual test engine, a functional test mode of said integrated circuit in said test environment, wherein said test environment comprising the virtual test engine and an integrated circuit tester, said virtual test engine communicating with said integrated circuit tester via a command interface to perform a functional test during the functional test mode and to perform a non-functional test during a non-functional test mode, and said integrated circuit tester is connected to said integrated circuit via an interface;
    creating and transmitting, by the virtual test engine, a first functional test command of at least one functional test command respectively comprising stimulus data and expected response data to said integrated circuit tester, wherein said integrated circuit tester creates and applies test patterns corresponding to the stimulus data of the first functional test command to the integrated circuit, receives and analyzes response data from said integrated circuit, and transmits test results including said response data to said virtual test engine for further analyzing, responsive to determining that the response data from the integrated circuit is similar to the expected response data in the first functional test command;
    enabling said non-functional test mode of said integrated circuit, responsive to determining by the virtual test engine that the first functional test command had failed, followed by generating and transmitting, to the integrated circuit tester, a first non-functional test command of at least one non-functional test command directing the integrated circuit tester for;
    shifting a serial bit stream out of said integrated circuit in said non-functional test mode and for transmitting said serial bit stream as an error bit stream to said virtual test engine for further analyzing; and
    re-enabling the functional test mode of the integrated circuit responsive to determining to test the integrated circuit for further analysis based on storing and analyzing the error bit stream by the virtual test engine,
    wherein said virtual test engine creates and transmits a second functional test command of the at least one functional test command to said integrated circuit tester.

15. The computer program product according to claim 14, wherein the at least one of said test result or said error bit stream is analyzed by comparing response data of said test result or said error bit stream with expected response data as function of said stimulus data.

16. The computer program product according to claim 15, wherein said functional test mode allows a direct response action or an indirect response action via an intermediate response action based on a certain stimulus.

17. The computer program product according to claim 14, wherein said integrated circuit tester supplies a stability bit pattern to all pins of said interface of said integrated circuit not involved in said functional test.

18. The computer program product according to claim 14, wherein said integrated circuit tester prepares a test vector memory of the integrated circuit tester by setting signal level, signal timing and pattern templates to perform said functional test.

19. The computer program product according to claim 18, wherein said integrated circuit tester stores at least two pre-defined test patterns in said test vector memory and selects one of the pre-defined bit patterns or any combination of composite bit pattern subsets in the test vector memory in dependence of a subset of bits in the received bit stream of said response data.

20. The computer program product according to claim 18, wherein said integrated circuit tester creates a shmoo plot during said function test by monitoring at least two parameters while varying at least one of said parameters over a specified range.

* * * * *